(12) United States Patent
Frame

(10) Patent No.: US 7,292,044 B2
(45) Date of Patent: Nov. 6, 2007

(54) INTEGRATING TIME MEASUREMENT CIRCUIT FOR A CHANNEL OF A TEST CARD

(75) Inventor: James Frame, Haverhill, MA (US)

(73) Assignee: Analog Devices, Inc., Norwood, MA (US)

( * ) Notice: Subject to any disclaimer, the term of this patent is extended or adjusted under 35 U.S.C. 154(b) by 0 days.

(21) Appl. No.: 11/282,297

(22) Filed: Nov. 18, 2005

(65) Prior Publication Data

US 2006/0123303 A1 Jun. 8, 2006

Related U.S. Application Data

(60) Provisional application No. 60/629,673, filed on Nov. 19, 2004.

(51) Int. Cl.
*G01R 31/11* (2006.01)
*G01R 31/08* (2006.01)
*G01R 31/02* (2006.01)
*G01R 29/26* (2006.01)

(52) U.S. Cl. ............... 324/532; 324/535; 324/754; 324/763; 702/69

(58) Field of Classification Search ............ 324/532, 324/535, 754, 763; 702/69
See application file for complete search history.

(56) References Cited

U.S. PATENT DOCUMENTS

| | | | | |
|---|---|---|---|---|
| 3,553,582 | A  * | 1/1971 | Gouillou | 368/118 |
| 6,721,920 | B2 * | 4/2004 | Rearick et al. | 714/815 |
| 6,795,496 | B1 * | 9/2004 | Soma et al. | 375/226 |
| 6,867,613 | B1 * | 3/2005 | Bienek | 324/765 |
| 2003/0006750 | A1 * | 1/2003 | Roberts et al. | 324/76.53 |

* cited by examiner

*Primary Examiner*—Andrew H. Hirshfeld
*Assistant Examiner*—Amy He
(74) *Attorney, Agent, or Firm*—Bromberg & Sunstein LLP

(57) ABSTRACT

In a first embodiment of the invention there is provided an electronic chip for use with an automatic testing equipment device testing a device under test. The device under test has a plurality of pins and the electronic chip is placed in a channel of a test card that is associated with one of the pins. An input signal is provided to a pin of the device under test and the resulting output is provided to the pin electronics for the channel of the test card. In most embodiments, the output signal is a voltage signal. One purpose for the electronic chip is to measure jitter based upon timing measurements performed by the electronic chip. Jitter measurements are particularly important for high-speed serial devices. The electronic chip includes an integrating time measurement circuit for receiving the input signal and producing an output signal including a timing measurement of at least a portion of the input signal.

18 Claims, 8 Drawing Sheets

INTEGRATED TIME MEASUREMENT UNIT

Time to Voltage conversion

US 7,292,044 B2

INTEGRATING TIME MEASUREMENT CIRCUIT FOR A CHANNEL OF A TEST CARD

PRIORITY

The present application claims priority from U.S. Provisional Application 60/629,673 filed on Nov. 19, 2004 entitled "Integrated Time Measurement Circuit for a Channel of a Test Card", which is incorporated herein by reference in its entirety.

TECHNICAL FIELD AND BACKGROUND ART

The present invention relates to automatic testing equipment for evaluating the performance of integrated circuits prior to their shipment to customers and more specifically to the testing of integrated circuits for jitter.

Among other things as shown in FIG. 1A, testing equipment typically includes a large number of "test cards" (110 . . . 120) that each includes circuitry (112 . . . 114, 122 . . . 124) for communicating with one or more corresponding pins of an integrated circuit being tested. The integrated circuit is referred to in the art as the "device under test," or "DUT". Each pin (Pin A, Pin B etc.) of the DUT is associated with a separate channel (Channel A, Channel B etc.) on the test card. Each channel of a test card (110 . . . 120) may include pin electronics including a so-called "pin driver" for transmitting a test signal to its corresponding pin on the DUT. The pin electronics (112 . . . 114, 122 . . . 124) may also include a load, a precision measurement unit (PMU), a comparator and other electronics. The channel of the test card may also include an input path for receiving the output of the DUT. Normally associated with this input path is a comparator. To that end, the pin driver and the input path/comparator typically are connected to a corresponding pin via a relatively short transmission line.

Jitter is the deviation in or displacement of some aspect of the pulses in a digital signal. The deviation can be in terms of amplitude, phase timing, or the width of the signal pulse. Among the causes of jitter are electromagnetic interference (EMI) and crosstalk with other signals. As signal frequencies increase, jitter becomes a greater problem. For example in high speed serial communications such as PCI Express, FibreChannel and SONET jitter can result in data errors as timing accuracy is crucial.

In prior art automatic testing systems, precision time measurement equipment was an afterthought. For example, in certain prior art automatic testing equipment systems, the time measurement circuitry was separate on a separate board from the individual pin electronics and not associated with a specific channel. The time measurement circuitry was incorporated into the timing generator shared among multiple channels and was only capable of obtaining course time measurements due to a counter-based oversampling methodology. Other prior art systems have integrated more accurate time measurement equipment in the test head of the automated testing equipment however, the time measurement equipment was shared by all pins of a DUT and therefore the testing of jitter would require separate sequential tests for each pin. As a result, time measurement would take a substantial amount of time and therefore was cost ineffective.

Other testing companies have developed external testing equipment which can connect to one or more pins of a DUT, but these external timing measurement devices often fail due to errors caused by cable length and the communication time that is required for running a timing test. Further, these devices have a limited number of connections and as the pin count for DUTs grow, and the size of the DUTs decrease, complete timing tests cannot be performed on a single DUT without reconnecting the connections to separate pins of the DUT. Thus, the process for determining if jitter is present is inefficient.

SUMMARY OF THE INVENTION

In a first embodiment of the invention there is provided an electronic chip for use with a channel of a test card of an automatic testing equipment device. A channel of a test card is defined by the pin electronics and the output that couples to a single pin of the device under test. There is a one-to-one correspondence between the pin electronics and the pin of the device under test for each channel. The electronic chip is therefore associated with a single pin of a device under test. The channel can be envisioned as the path between the pin electronics of the automatic testing equipment device and a pin of the device under test.

An input signal is provided to one or more of the pins and the resulting output is read from one of the pins through a channel of the test card. In most embodiments, the output signal is a voltage signal. One purpose for the electronic chip is to measure jitter based upon timing measurements. Jitter measurements are particularly important for high-speed serial devices. The electronic chip includes an integrating time measurement circuit for receiving the input signal and producing an output signal including a time measurement of at least a portion of the input signal. The electronic chip is integral with the substrate. The substrate may be a piece of silicon or gallium arsenide for example. By placing the electronic chip into each channel of the test card, the automatic testing equipment device can simultaneously test multiple pins of the device under test and can produce precise time measurements of the signals coming from the device under test.

The timing measurement circuit includes an integrator. In certain embodiments the input signal is processed in a differential mode and the integrator is a differential integrator. The timing measurement circuit may also include a comparator for comparing the input signal to a threshold signal. When the timing measurement circuit operates in a differential mode there are at least a plurality of comparators. Each comparator can compare the input signal to a separate threshold signal. The timing measurement circuit also includes a control circuit wherein the control circuit selects the edges of the input signal to be measured. When the timing measurement circuit operates in a differential mode, each comparator receives the voltage input signal and is electrically coupled the control circuit. The control circuit may include an XOR gate and a D flip-flop. In one embodiment, the output of each XOR gate is electrically coupled to a clock input of a D flip-flop. The output of each D flip-flop is electrically coupled to an input of the differential integrator. Thus, the differential integrator receives in the edges of the input signal that are to be integrated and produces an output signal that represents the time between the two edges.

The electronic chip may be coupled to an analog to digital converter for converting the integrator output into a digital signal, wherein the digital signal will represent the time between when the input signal reached the voltage level of the first threshold voltage level and when the input signal reached the voltage level of the second threshold level.

The integrating time measurement circuit may use the comparators that are already part of the pin electronics of a channel of a test card and therefore, the added circuitry to the test card would include only the control circuit and the integrator for that channel. Thus, in this embodiment, only a limited amount of circuitry need be added to a channel of a test card to perform individual time measurement for a pin of a device under test.

The electronic chip may also include other circuits on the substrate beside the integrating time measurement circuit. For example, the electronic chip may also include any pin electronic circuit, including, but not limited to a parametric measurement unit, a driver circuit, an analog to digital converter, and a comparator. Further, the electronic chip may also include test card circuitry on the substrate, including but not limited to, memory, formatter circuitry, timing generator circuitry, power supply circuitry, or relays.

BRIEF DESCRIPTION OF THE DRAWINGS

The foregoing features of the invention will be more readily understood by reference to the following detailed description, taken with reference to the accompanying drawings, in which:

FIG. 4 shows the circuit and the timing signals used to measure the rise time of an input signal;

FIG. 5 shows the circuit and the timing signals used to measure half of a period of an input signal;

FIG. 6 shows the circuit and the timing signals used to measure the period of an input signal;

DETAILED DESCRIPTION OF SPECIFIC EMBODIMENTS

Figure 1:
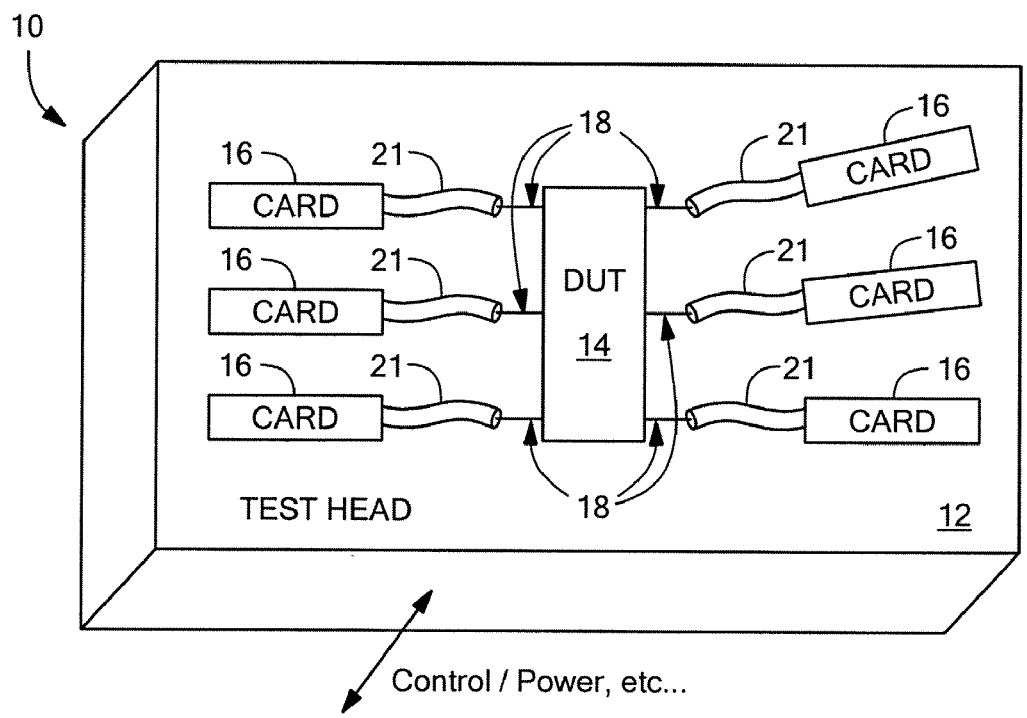
FIG. 1 is a schematic diagram of an automatic testing device.

FIG. 1 schematically shows a portion of an automatic testing device 10 that may be configured in accordance with illustrative embodiments of the invention. In particular, the testing device 10 includes a test head 12 with a socket (not shown) for receiving a device to be tested. The device to be tested may be any device commonly tested by such testing equipment, such as an integrated circuit. By way of example, the integrated circuit may be a VLSI chip, or a memory chip. Those skilled in the art commonly refer to the device being tested as the "device under test," or the "DUT" (identified herein by reference number 14).

The test head 12 includes electronics for testing each pin 18 on the DUT 14. To that end, the test head 12 includes a plurality of testing cards 16 and each testing card has a separate channel for testing each pin 18 on the DUT 14. The DUT 14 shown in FIG. 1, for example, has six pins 18 and thus, there are six separate channels. For exemplary purposes only, the test head 12 includes six test cards 16 to test all the pins 18 on the DUT 14. Therefore, there is only a single channel for each of the test cards. In practice, this is not the case, and a test card will generally have a plurality of associated channels. Additionally, test heads commonly have more than six test cards 16, therefore it should be noted that six test cards 16 are shown as exemplary only and not as a limitation of various embodiments of the invention. In a similar manner, the DUT 14 can have more than six pins 18. Accordingly, discussion of six pins 18 also is by example only and not intended to be a limitation on various embodiments of the invention.

Each channel of a test card 16 includes a driver circuit ("driver 20," shown in FIG. 2) for transmitting a test signal to the pin 18 that it is testing, and a comparator apparatus ("comparator," shown in FIG. 2) for analyzing any data signal received from the pin 18. Of course, if the pin 18 is for receiving an input signal only, then only the driver 20 is used. In a similar manner, if the pin 18 is for transmitting an output signal only, then only the comparator apparatus is used. Of course, if the pin 18 is for both input and output, then both the driver 20 and comparator apparatus may be used. Each channel of a test card 16 also includes an input for receiving control data, power, and other related information from another part (not shown) of the testing equipment. Other types of testing devices may be used with the present invention, including split I/O configuration test systems where the drivers and comparators are not permanently connected inside the pin electronics or inside the test card or test head.

Figure 2:
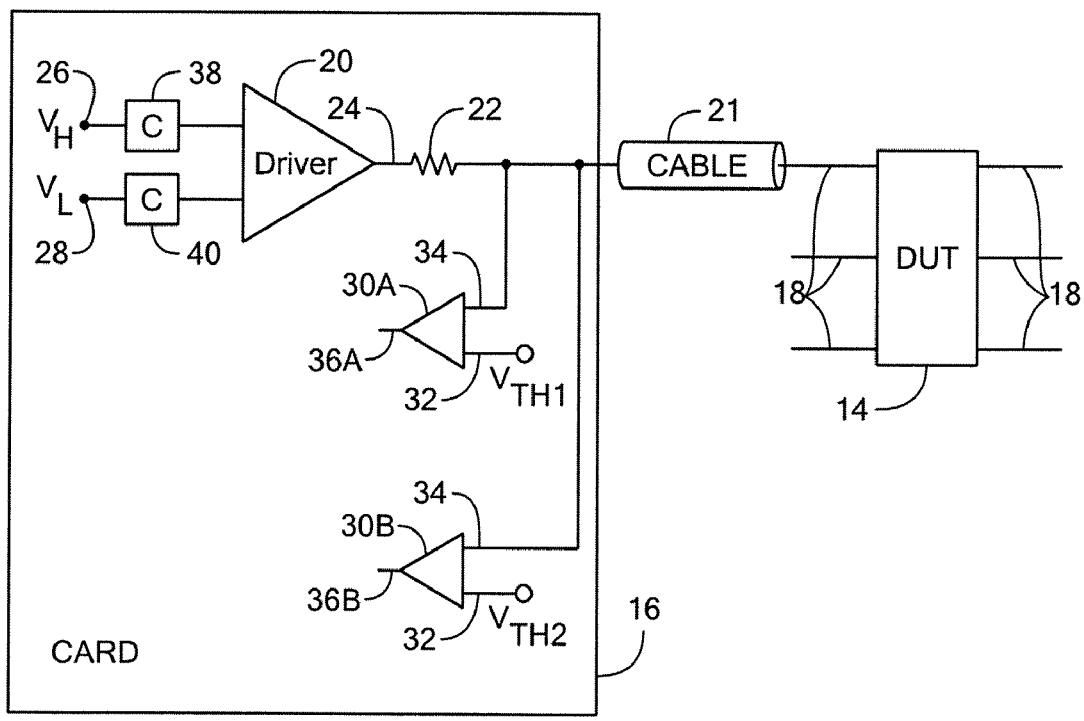
FIG. 2 is a detailed schematic diagram of a testing card.
Figure 1A:
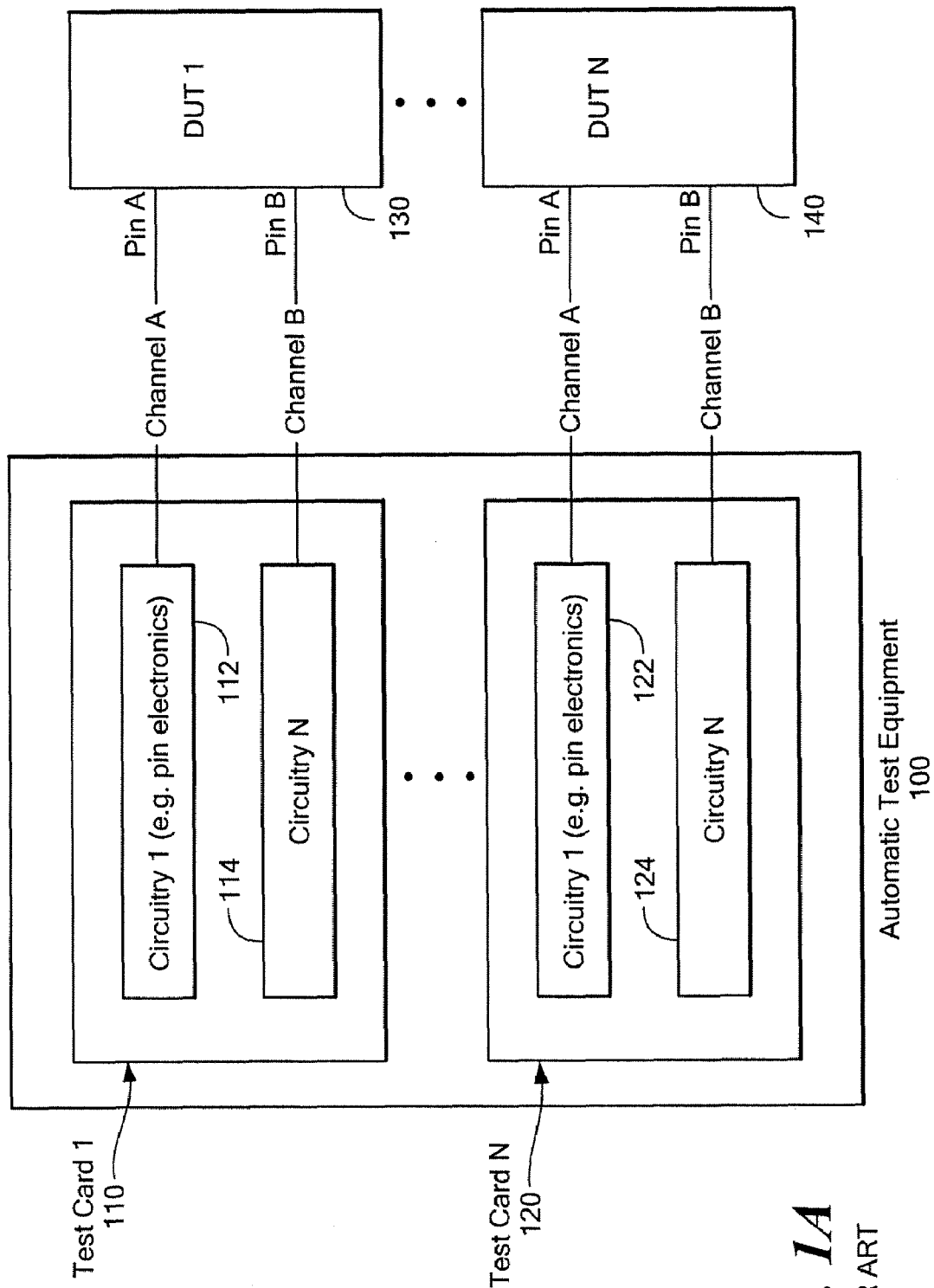
FIG. 1A is a block diagram of a prior art automatic testing device.

FIG. 2 schematically shows details of an exemplary channel of a testing card 16. In particular, the channel of the testing card 16 includes a driver 20 (noted above) that is connected to one pin 18 on the DUT 14 via a transmission cable 21. In illustrative embodiments, the transmission cable 21 has a characteristic impedance (e.g., about 50 ohms), and is terminated on its driver side by a termination resistor 22. It is preferable for the combined resistance of the termination resistor 22 and the driver output to match the impedance of the transmission cable 21 (e.g., fifty ohms for a fifty ohm transmission cable 21). The driver 20 also includes an output ("driver output 24") for transmitting a testing signal to the DUT 14 (via the cable 21), and a pair of DC voltage inputs 26 and 28 for clamping the maximum and minimum amplitude of the output testing signal. The DC voltage inputs 26 and 28 therefore include a voltage high input (referred to herein as "Vhigh input 26"), and a voltage low input (referred to as "Vlow input 28"). Exemplary voltages applied to the Vhigh and Vlow inputs 26 and 28 may be about 5 volts and 1 volt, respectively. Other types of drivers, including Class A drivers, may be employed with the present invention without deviating from the intended scope of the invention.

In addition to the above noted elements, the channel of the test card 16 also includes the prior noted comparator apparatus, which has a pair of comparators 30A and 30B. Each comparator 30A and 30B includes a threshold input 32 for receiving a DC threshold voltage, a return input 34 for receiving a data signal (from the DUT 14) to be compared against its respective threshold voltage, and a comparator output 36 for delivering output data reporting the results of the comparison. As known by those skilled in the art, each comparator 30A and 30B produces output data specifying the voltage of the received data signal relative to its threshold voltage. In various embodiments, the threshold voltage on one comparator 30A or 30B is set to be higher than that of the other comparator 30A or 30B. Accordingly, the higher threshold voltage is known as the "high threshold voltage," while the lower threshold voltage is known as the "low threshold voltage." Those skilled in the art should understand, however, that many different types of comparator devices can be used. Accordingly, the disclosed comparator apparatus is exemplary only and not intended to limit various embodiments of the invention. For, example a differential comparator may be used wherein the difference between two input signals are compared to a reference voltage level.

Figure 3:
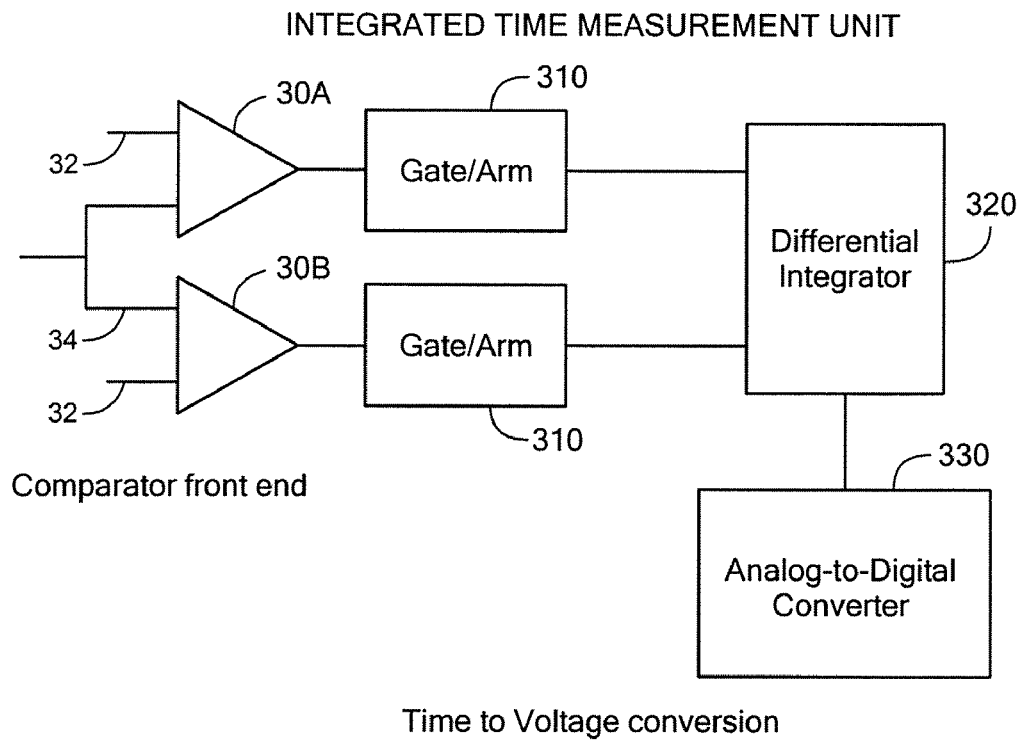
FIG. 3 is a block diagram of the integrated time measurement circuitry that is incorporated into each of the test cards.

FIG. 3 shows a block diagram of an integrating time measurement circuit coupled to a DUT pin. The integrating time measurement circuitry is integral with a substrate defining an electronic chip, and this electronic chip can be placed on a test card defining a channel. The electronic chip may include other circuitry in addition to the integrating time measurement circuitry including pin electronics and test card circuitry. The electronic chip may include pin electronics, such as, comparators, precision measurement units, analog to digital converters, and driver circuits. The electronic chip may include test card circuitry, such as, memory, formatter circuits, timing generator circuits, power supply circuits and relays.

In one embodiment the integrating time measurement circuitry is coupled to the comparators of FIG. 2. The cable 21 of FIG. 2 provides the test signal from the DUT to the one or more comparators 30A and 30B that are coupled to the input cable. In the present embodiment as shown, the single ended input signal is split and time measurements can be Is performed in a differential manner. As already stated, many different types of comparators may be employed, and each comparator may either receive the same threshold signal or a different threshold signal depending upon the particular embodiment. In other embodiments, a differential comparator may be used. For example, a differential amplifier could be placed in front of the comparators of FIG. 4, in order to produce a single ended difference signal. Thus, the combination of the differential amplifier and the single-ended comparators creates a differential comparator.

In the present configuration, as shown, the output of the comparator circuits lead to the input of control logic. The control logic 310 passes the edges of interest of the input signal to an integrator and includes the ability to reset the time measurement. At the output of the control logic 310 is an integrator 320 that in this embodiment is a differential integrator. The differential integrator 320 will measure the difference between the two edge signals that are input from the control logic. Thus, an analog signal will be the output, which represents the time measurement. The differential integrator 320 outputs this analog signal into an analog-to-digital converter 330. The analog-to-digital converter 330 receives as input the analog signal and converts the analog signal to a digital equivalent.

Figure 3A:
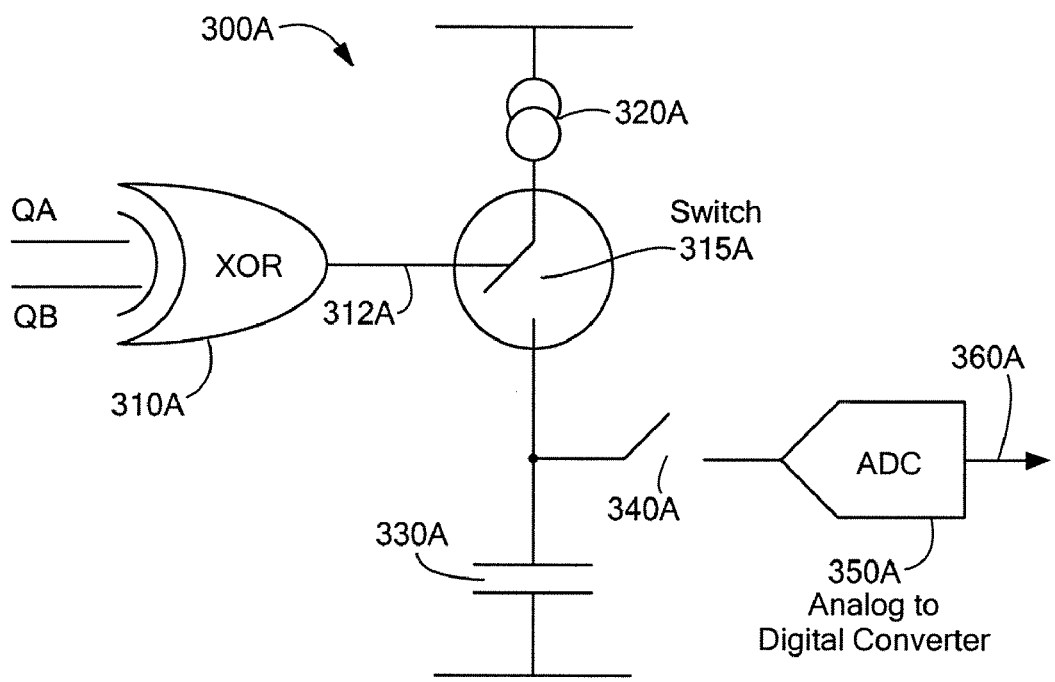
FIG. 3A is a schematic diagram showing a single ended integrator.

The time measurement circuitry need not operate in a differential mode, but can operate in a single-ended mode. For example, each comparator may be coupled to a separate integrator and operate in a single ended mode as shown in FIG. 3A.

Figure 4:
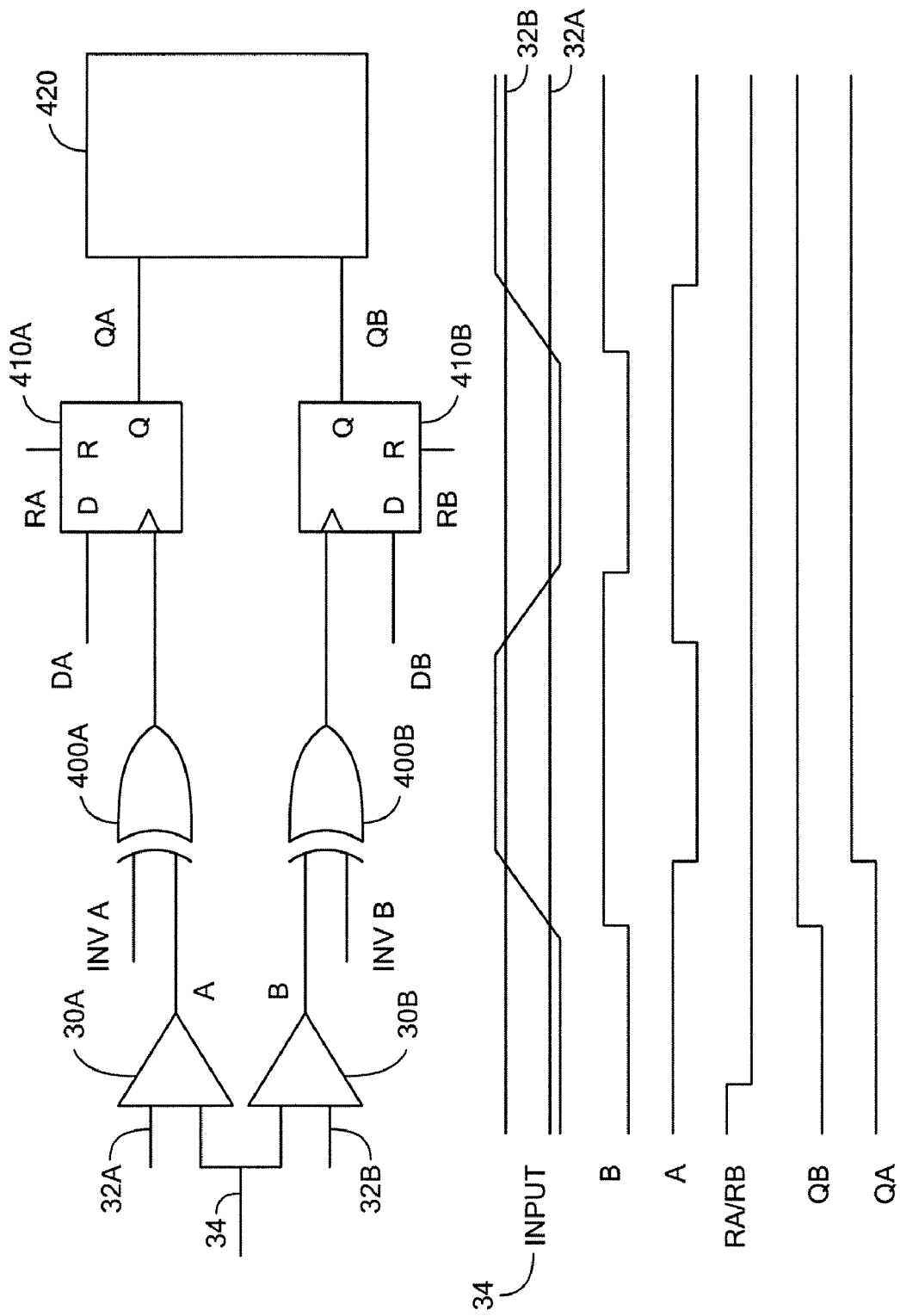
FIGS. 4-6 show a more detailed embodiment of the circuit of FIG. 3 along with a corresponding example of the signals that may be used to measure different time intervals.
Figure 5:
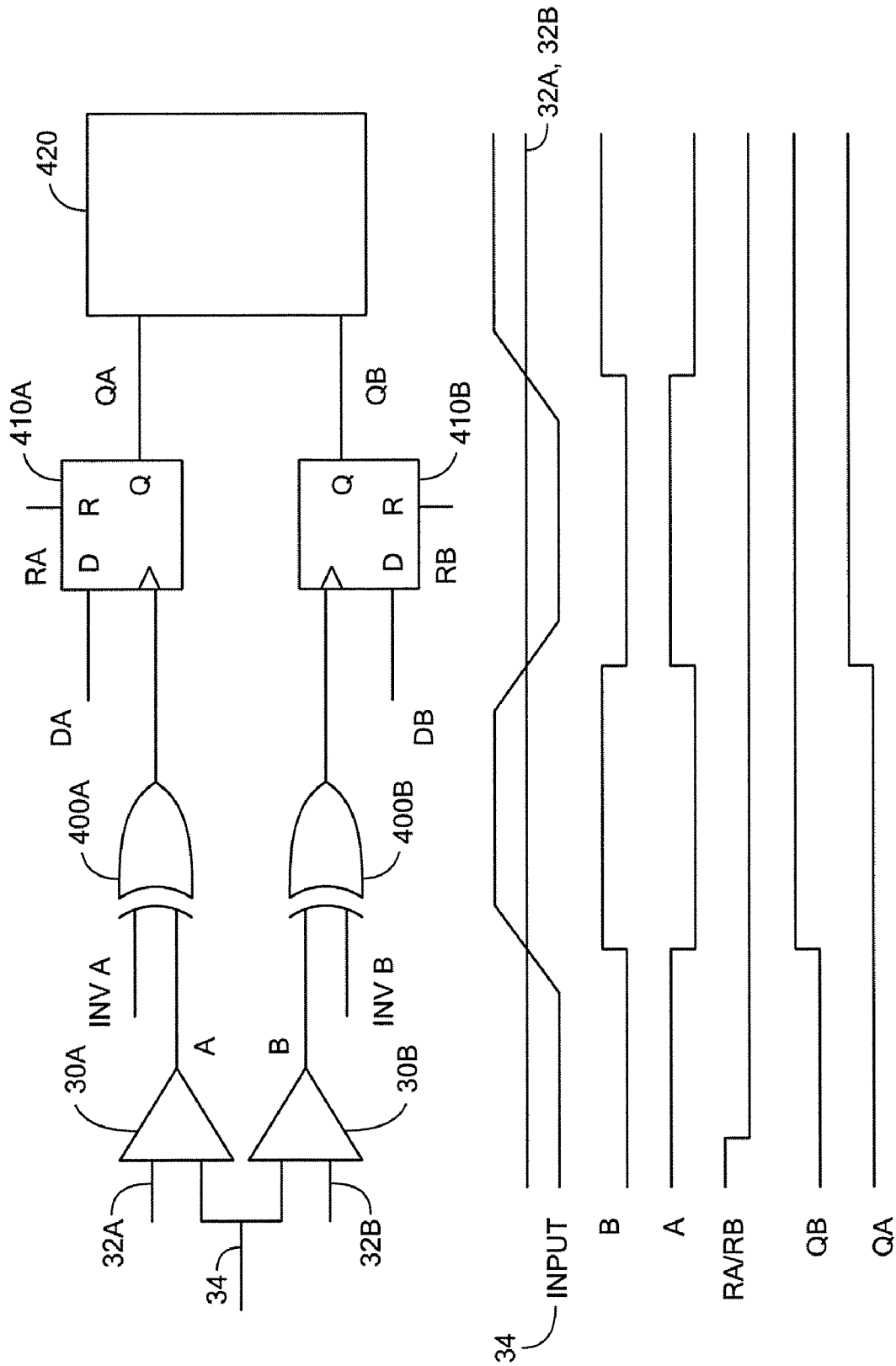
Figure 6:
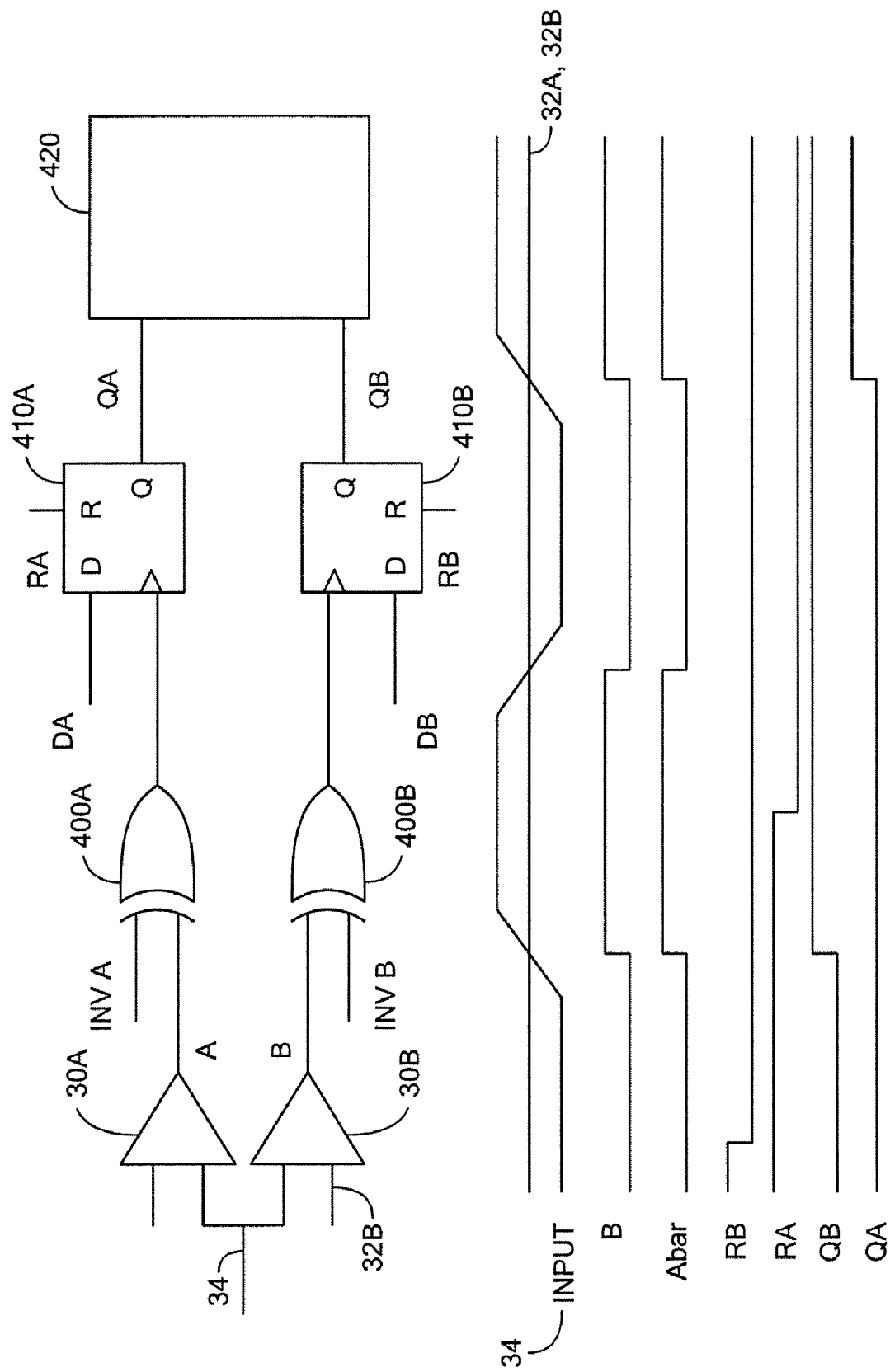

FIGS. 4-6 show a variation of the embodiment of the time measurement circuit of FIG. 3 along with a corresponding example of the signals that may be used to measure different time intervals. The circuit remains the same for each example and only the threshold signals and reset signal changes. It should be understood by one of ordinary skill in the art that the logic of the timing circuit may be implemented in any one of a number of ways without deviating from the intent of the invention. As a result, the circuit shown in FIGS. 4-6 is exemplary only. FIG. 4 shows a more detailed version of the circuit of FIG. 3 where the threshold and reset signals are used to locate the edges at different times during the periodic input signal. The input signal from the DUT is then provided to a first and a second comparator 30A and 30B. First, a reset signal is issued for each of the D Flip-flops 420. The first comparator 30A receives the input signal 34 at one of its input terminals and a threshold is signal 32 at the other input. The threshold signal 32 for the first comparator is set to a constant level that is above the low signal level of the system. The first comparator 30A produces an output signal A by comparing the input signal 34 and the threshold voltage 32A. The comparator is constructed such that when the input signal is below the threshold signal 32A, then output signal A is high. The second comparator 30B compares the input signal to a different threshold signal 32B and the second comparator will produce a high output signal when the input signal rises above the low threshold signal. The second threshold signal 32B is set to a constant level that is just below the high signal level. In other embodiments, other comparators having inverted output may be used in order to provide the same result identifying edge transition. Output signals A and B are electrically provided to the control circuitry.

In the shown embodiment the control circuitry consists of an exclusive OR gate (XOR) 400A,B followed by a D Flip-flop 410A,B. The XOR gates 400A,B are used for inversion control. If inversion control is not desired, the XOR gate may be removed from the circuit. The XOR gates 400A,B receive the output of the comparator. If an application requires the signal to be inverted, INV A and INV B are set to a logic level equivalent to a 1. As a result, the output of each comparator will be inverted. If the signals are not required to be inverted, signals INV A and INV B are set to a logic level equivalent of 0. The output of the XOR gate is provided to the D flip-flop as a clocking signal. After receiving the clocking signal, the data signal input DA will then be output as QA from the D Flip-flop 410A. In the shown embodiment, DA and DB are always high signals. Thus, the transition of the original input signal above the threshold is captured by the QA output signal. The D Flip Flop 410B receives the clock signal for signal B when signal B transitions above the lower threshold. This transition is captured and visible in QB and the signal is at a high level until the reset signal RA,RB is provided. Thus, the edge transitions are captured and visible in signals QA and QB. The signal QA transitions from low to high when the input signal begins its transition from a low to a high signal and the signal QB transition from low to high when the input signal ends its transition from low to high.

Signals QA and QB are provided to a differential integrator 420 and the integrator integrates while the input signals QA and QB are different. This analog output can then be provided to an analog-to-digital converter to obtain a digital representation of the transition time.

A single ended integrator 300A may also be employed as shown with respect to FIG. 3A. In one embodiment, the inputs to this integrator are signals QA and QB from FIG. 4. Thus, not shown in FIG. 3A are the comparators, XOR gate and control circuit (D flip-flops) of FIG. 4 which precede this integrator circuit. It should be understood by those of ordinary skill in the art that other circuit elements may also be used preceding the single ended integrator depending on the desired functionality and the polarity of the input signals. The signals QA and QB are XOR'ed together in an XOR logic circuit 310A and the resultant signal 312A is used to control a switch 315A. This switch 315A connects a current source 320A to a capacitor 330A having a first plate and a second plate. The first plate of the capacitor is coupled to the switch 315A and the second plate of the capacitor is coupled to ground/a lower potential. When the switch 315A is closed the current source 320A is connected to the first plate of the capacitor 330A and the current source charges the first plate of the capacitor 330A, generating a voltage across the capacitor 330A. After the switch 315A is closed, a second switch 340A is opened that connects one side of the capacitor to an analog to digital converter 350A. The analog to digital converter 350A is used to measure the voltage and thus, provides the integrated output 360A.

FIG. 5 shows the same time measurement circuit as FIG. 4, however the threshold signals differ allowing measurement of half of the period of the cyclical signal input. In other words, the time measurement circuit captures the time interval during which the DUT signal is high.

The reset signal is asserted in this embodiment at a time before which a measurement is to be taken. The reset signal RA, RB is provided to the reset input of each of the D Flip-flops 410A, 410B. In this embodiment, there is only one threshold signal at the input to the comparators. If the signal is below the threshold 32A, the first comparator 30A produces a high output for A. If the signal 34 is above the threshold 32B, the second comparator 30B produces a high output for B. Thus, the A and B signals are inverse. The signals A and B are then each passed to a separate XOR gate 410A, 410B for inversion control. The output of the XOR triggers the clock of the respective D Flip-flop 410A, 410B. Both the DA and DB data signals are set to a constant high level. It can be imagined that the system could be configured such that the data signals are both constant low level signals in other embodiments. As a result, in the present embodiment, the output of the D Flip-flop (QA) locks high the first time that transitions from a low to a high signal and the output of the second D Flip-Flop (QB) locks high the first time that B transition from a low to a high signal. The two signals QA and QB are input into a differential integrator 420 which integrates between QA and QB representing the rising edge and the falling edge of the input signal. The differential integrator produces an analog signal representative of the time between those events. The analog signal can then be passed into an analog-to-digital converter and a digital value will be produced that represents a half period of the cyclical signal.

FIG. 6 shows another example using the circuit of FIGS. 4 and 5 where the desired time measurement is the entire period of the input signal. In this embodiment, the reset signals are independent such that RA and RB are triggered at different times. RA is triggered at a point after the first low to high transition of the cyclical input signal and RB is triggered before the beginning of the period of the cyclical signal to be measured. There is a single threshold signal 32A, 32B that is passed to both of the comparators. The threshold signal is preferably at the midpoint between a high and a low transition. However, the threshold could be at any other level between the high and the low levels. The first comparator 30A compares the threshold signal to the input signal and if the input signal is below the threshold, the output of the comparator A goes high. If the input signal goes above the threshold value, the output of the comparator A goes low. The inverse is true for the second comparator 30B, wherein if the input signal is below the threshold value, the output of the comparator B is low, and if the input signal is above the threshold value, the output of the comparator B goes high. As a result, A and B are inverse signals. After each D flip-flop 410A, 410B has received a reset signal, the clock input will be triggered by the output of the XOR gates 400A, 400B. As previously indicated, the XOR gate is present for inversion control and can be set to invert the output of the comparator if necessary. If inversion is desired, each of the XOR gates will be provided with a logic level 1 equivalent signal for INV A and INV B. As shown in FIGS. 4-6, if the signal is not to be inverted, INV A and INV B are provided with a logic level 0 equivalent signal and therefore, signal A and B are passed as the clock signals to their respective D flip-flops. As before, the data signals DA and DB are both constant high level signals. This will produce an output signal, QA that occurs at the end of the period during the final transition between low and high. The input data signal of the second D Flip-flop 410B is the data signal DB. Data signal DB will produce QB at the output of the D Flip-flop 410B and QB will identify the edge for initial transition from a low to a high state for the period of the input signal. The signals QA and QB which represent the edge signal for the start and end of a period of the input signal are provided to a differential integrator 420 that integrates between the mid-point of the first transition from a low to high state and the mid-point of the second transition from a low to high state. Thus, the integrator 420 integrates the signal and outputs an analog signal representative of the time for an entire period. The analog signal can then be passed to an analog-to-digital converter and the time for the period will be converted to a digital representation.

These timing measurements can then be used to determine jitter values for each pin of the DUT. By having the timing measurement circuit associated with a separate channel of a test card, jitter can be measured simultaneously during a single testing period. Based upon the test being performed, multiple pins of the DUT can be tested in parallel. Further, the circuitry provides a substantially accurate testing circuit that does not require any external connections to the automatic testing equipment. As presently shown, there is only one time measurement circuit for a single channel, however in other embodiments there could be a plurality of time measurement circuits that could operate in parallel within a single channel. If for example three time measurement circuits were within the channel, each of the time measurements obtained in FIGS. 4-6 could be made in parallel, thus decreasing the amount of testing time that is required for each pin and for the entire DUT.

Figure 7:
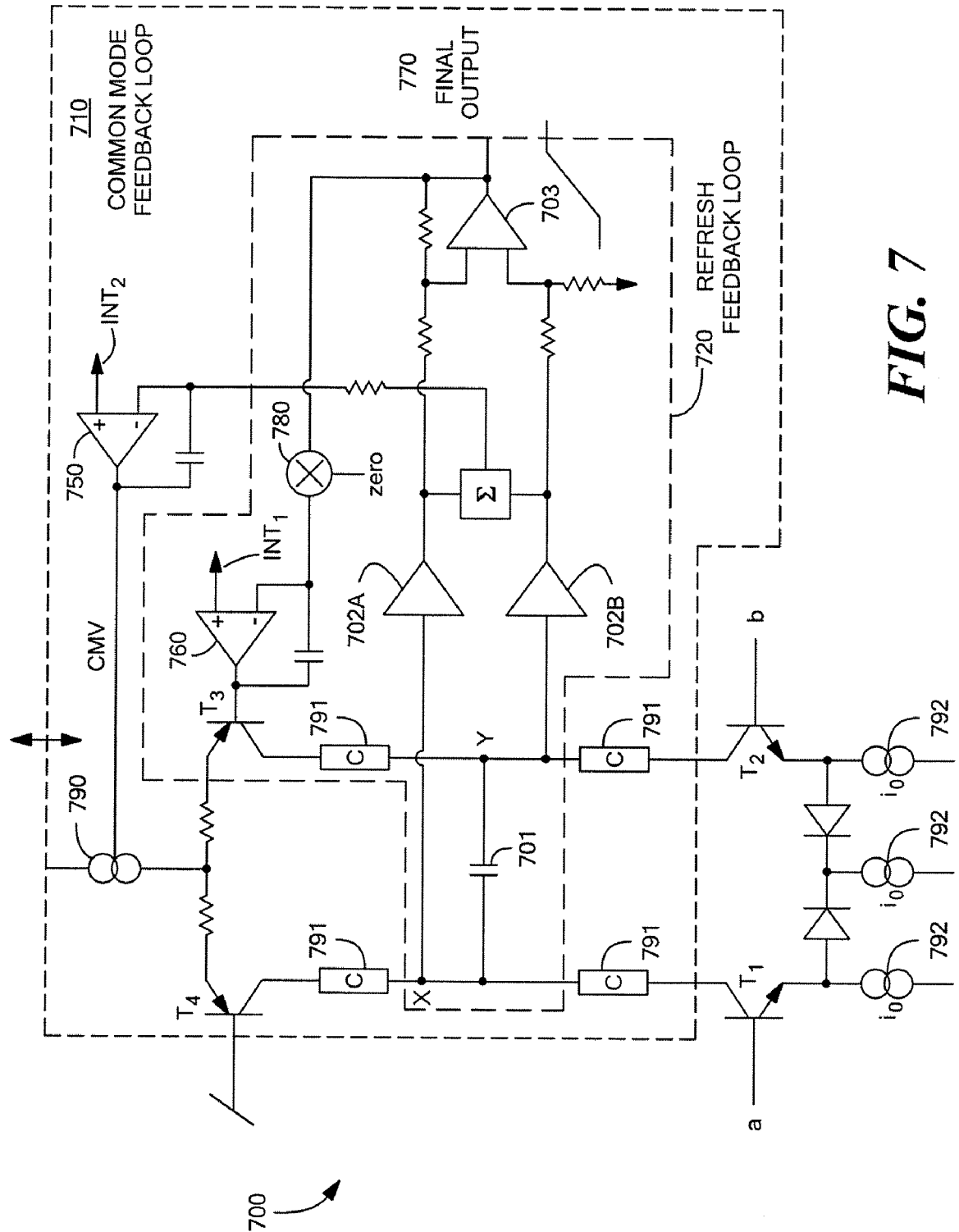
FIG. 7 is a schematic diagram showing one embodiment of the differential integrator.
Figure 7A:
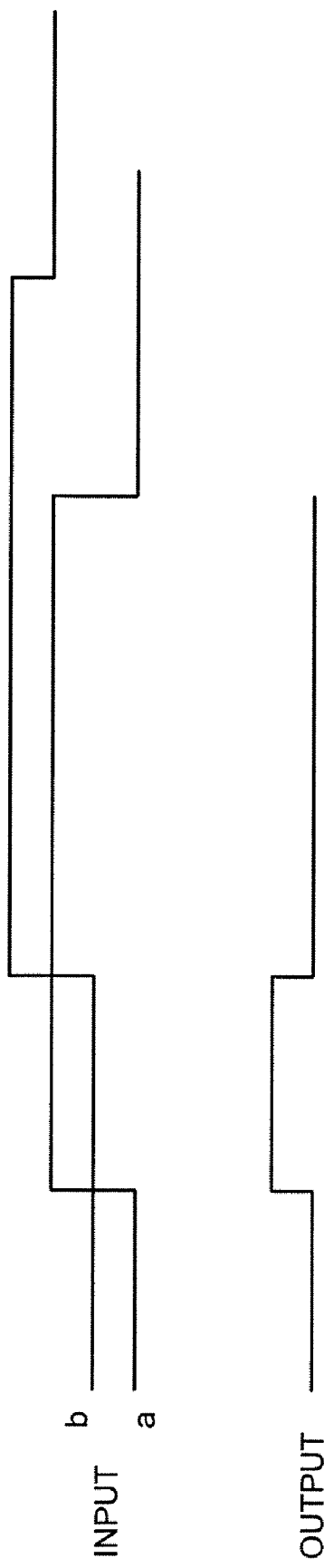
FIG. 7A shows a graph of an exemplary input and output of the differential integrator of FIG. 7.

The differential integrator may be implemented using a circuit similar to that shown in FIG. 7. However, other differential integrators will operate with the circuits of FIGS. 3-6. The circuit 700 accepts two voltage inputs, labeled a and b in the figure into a differential transistor pair T1, T2. The circuit integrates when a and b are at different voltage levels. During the integration, the circuit stores charge on the capacitor 701 between nodes x and y. If the voltage level of input a is greater than the voltage level of input b, the circuit 700 will integrate in one direction causing charge to be added to the capacitor plate electrically coupled to the a input, see FIG. 7A. If the input voltage a is less than the input voltage b, charge will be added to the capacitor plate that is electrically coupled to the input b, see FIG. 7A. The output of the integrator is taken as the differential voltage across nodes x and y. To gain access to these nodes, each node is buffered by one of the buffers 702. The output of the buffers 702A,B is the input to a differential amplifier 703 producing a single ended output. The circuit also includes a plurality of cascode amplifiers 791. The cascode amplifiers 791 are included to control the common mode voltage range of the capacitor and reduce the impact of the Early voltage of transistors T1-T4. Transistors T1 and T2 are coupled at their emitters to three current sources that are labeled $i_0$ 792. The middle current source charges and discharges the capacitor. The outer current sources provide current if the current flowing through the differential circuit exceeds $i_0$. Although all three current sources are shown as being equal, the two outer currents sources need not be equal to the middle current source.

The integrator 700 includes two feedback loops. The first feedback loop, the common mode feedback loop 710 controls the common mode voltage present at nodes x and y. The second feedback loop, the refresh feedback loop 720 resets the differential voltage between nodes x and y.

The common mode feedback loop 710, which controls the common mode voltage operates by taking the average of the voltage at nodes x and y (shown in the diagram as a summer 740). This average is input to an integrator 750. The voltage on the integrator's other input, int2, is fixed to a value that will set the common mode voltage level. The common mode voltage level is input to one half of a differential pair T3, T4 at T3. The base of T4 is set at an appropriate bias level for the circuit based upon the specifications of the components used. The integration time constant for integrator 750 is set to a specific time determined by the desired end application. A fast integration time is useful for very large swings at nodes x and y, so that neither node x or y saturates transistors T1-T4. A slower integration time limits the swing present at nodes x and y, but removes any effects that the common mode voltage might have on the measurement linearity.

The refresh feedback loop 720 resets the differential voltage between timing measurements by taking the final output 770 and feeding it through an integrator 760 to transistor T3. The other integrator input Int1 is set to an optimal value The inputs Int1 and Int2 are set to levels that are appropriate for the circuit. For example, Int1 can be coupled to ground or close to ground depending on any offset voltages that are present. Int2 can be set to the common mode voltage desired at nodes x, y or at another value that causes current source 790 to set nodes x and y at the desired common mode voltage. A switch 780 is provided in the refresh feedback loop (shown as a multiplier, circle with an X in the middle). During normal operation of the circuit 700, when a timing period is being measured, the switch is connected to a zero voltage input or coupled to ground. When a new measurement is being taken, the circuit 700 is refreshed. The switch 780 is connected to the final output 770. The final output 770 causes transistor T3 to allow current to flow until a zero differential voltage across nodes x and y is reached. Once a zero differential voltage is achieved, the switch switches and a timing measurement may be taken.

Although various exemplary embodiments of the invention have been disclosed, it should be apparent to those skilled in the art that various changes and modifications can be made that will achieve some of the advantages of the invention without departing from the true scope of the invention.

What is claimed is:

1. An electronic chip in combination with a test card of an automatic testing equipment device, the automatic testing equipment device testing a device under test having a plurality of pins, the chip comprising:

a substrate; and
   an integrating time measurement circuit integral with the substrate and dedicated to a single pin of the device under test, the integrating time measurement circuit receiving an input signal from the pin of the device under test and producing an output signal including a timing measurement of at least a portion of the input signal.

2. The combination according to claim 1, further comprising: pin electronics integral with the substrate.

3. The combination according to claim 1, further comprising: test card electronics integral with the substrate.

4. The combination according to claim 1, wherein the integrating time measurement circuit includes an integrator circuit.

5. The combination according to claim 4, wherein the integrating time measurement circuit also includes a control circuit.

6. The combination according to claim 5, wherein the integrating time measurement circuit includes a comparator.

7. The combination according to claim 5, wherein the integrating time measurement circuit includes a plurality of comparators.

8. The combination according to claim 7, wherein the comparators are set to compare the input signal to at least one known transition value.

9. The combination according to claim 8, wherein each comparator receives the input signal and is electrically coupled to an input of an XOR gate.

10. The combination according to claim 9, wherein the output of each XOR gate is electrically coupled to a clock input of a D flip-flop.

11. The combination according to claim 10, wherein the output of each D flip-flop is electrically coupled to an input of the differential integrator.

12. The combination according to claim 11, further comprising an analog to digital converter for converting the integrator output into a digital signal.

13. The combination according to claim 5, wherein the control circuit includes a flip-flop circuit.

14. The combination according to claim 1, wherein the integrating time measurement circuit includes a differential integrator.

15. The combination according to claim 1, wherein the electronic chip is coupled to a test card for testing a single pin of a device under test.

16. The combination according to claim 1, wherein the input signal from the device under test is a voltage signal.

17. The combination according to claim 1, wherein the integrating time measurement circuit operates in a differential mode.

18. The combination according to claim 1, further comprising:

a second integrating time measurement circuit integral with the substrate for performing time measurement of the input signal in parallel with the first integrating time measurement circuit.

* * * * *

UNITED STATES PATENT AND TRADEMARK OFFICE
CERTIFICATE OF CORRECTION

PATENT NO. : 7,292,044 B2 Page 1 of 1
APPLICATION NO. : 11/282297
DATED : November 6, 2007
INVENTOR(S) : James Frame It is certified that error appears in the above-identified patent and that said Letters Patent is hereby corrected as shown below:

On title page, item 73 Assignee,
replace "Analog Devices, inc."
with --Analog Devices, Inc.--

Signed and Sealed this

Eleventh Day of March, 2008

JON W. DUDAS
*Director of the United States Patent and Trademark Office*